United States Patent
Tsai et al.

(10) Patent No.: US 7,195,975 B2
(45) Date of Patent: Mar. 27, 2007

(54) METHOD OF FORMING BIT LINE CONTACT VIA

(75) Inventors: Tzu-Ching Tsai, Taoyuan (TW); Yi-Nan Chen, Taipei (TW); Hui-Min Mao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 257 days.

(21) Appl. No.: 10/714,001

(22) Filed: Nov. 14, 2003

(65) Prior Publication Data
US 2004/0198008 A1    Oct. 7, 2004

(30) Foreign Application Priority Data
Apr. 7, 2003    (TW) .............. 92107877 A

(51) Int. Cl.
  H01L 21/8242    (2006.01)
  H01L 21/20    (2006.01)

(52) U.S. Cl. ...................... 438/256; 438/399

(58) Field of Classification Search ........ 438/239–240, 438/253–256, 396–399; 257/296, 303–304, 257/306
See application file for complete search history.

(56) References Cited

U.S. PATENT DOCUMENTS

| | | | |
|---|---|---|---|
| 6,399,438 B1 * | 6/2002 | Saito et al. | 438/253 |
| 6,458,651 B1 * | 10/2002 | Rhodes | 438/253 |
| 6,664,642 B1 * | 12/2003 | Koubuchi et al. | 257/776 |
| 6,690,053 B1 * | 2/2004 | Amo et al. | 257/306 |
| 6,815,752 B1 * | 11/2004 | Kitamura | 257/306 |

* cited by examiner

Primary Examiner—Thanhha Pham
(74) Attorney, Agent, or Firm—Quintero Law Office

(57) ABSTRACT

A method of forming a bit line contact via. The method includes providing a substrate having a transistor with a gate electrode, drain region, and source region, forming a conductive layer overlying the drain region, conformally forming an insulating barrier layer overlying the substrate, blanketly forming a dielectric layer overlying the insulating barrier layer, and forming a via through the dielectric layer and insulating barrier layer, exposing the conductive layer.

19 Claims, 10 Drawing Sheets

METHOD OF FORMING BIT LINE CONTACT VIA

BACKGROUND OF THE INVENTION

1. Field of the Invention

The present invention relates to a method of forming a bit line contact via, and more specifically to a method of forming a conductive layer in the bit line contact via.

2. Description of the Related Art

As the integrity of integrated circuits increases, the size of semiconductor devices are reduced. A 64 MB dynamic random access memory (DRAM) device for example, has a design requirement of 0.3 µm or less, while the design requirement of 128 MB and 256 MB DRAM is as low as 0.2 µm or less.

When the line width of a bit line contact structure is reduced to approximately 0.11 µm, for example, the width of the drain region exposed by a bit line contact via is also reduced to approximately 0.038 µm or less. When forming a conductive layer as a bit line contact (CB) in the bit line contact via, CB opening and word line-bit line shorts frequently occur, resulting in device failure, thereby negatively affecting the yield and cost of the process.

FIGS. 1A through 1F are cross-sections illustrating these problems in the conventional method of filling a bit line contact via.

In FIG. 1A, a substrate 100, such as single crystalline silicon, having a transistor structure, is provided. The substrate 100 has a gate electrode 120 protruding from an active surface of substrate 100. A drain region 112 and source region 114 are disposed on the active surface on two sides of the gate electrode 120 respectively. The gate electrode 120 is a word line, having a multi-level structure as needed. For example, the gate electrode 120 in FIG. 1A can include a gate dielectric layer 121, a polycrystalline silicon layer 122 and a metal silicide layer 123 serving as conductive layers, and a hard mask layer 124 sequentially the active surface of the substrate 100. The gate electrode 120 further has a spacer 125 on the sidewall, resulting in width of exposed drain region 112 between two neighboring gate electrodes 120 as large as approximately 0.038 µm or less when the design requirement is reduced to approximately 0.11 µm.

In FIG. 1B, a dielectric layer 130 and patterned resist layer 191 are sequentially formed on substrate 100. The patterned resist layer 191 has an opening 191a exposing a part of dielectric layer 130 at a predetermined position of a subsequent bit line contact via. The dielectric layer is typically between about 0.3 µm to 1.0 µm thick.

The subsequent steps include removing the exposed dielectric layer 130 in order to form the bit line contact via exposing the drain region 112, and filling a metal layer in the bit line contact via as a bit line contact. FIGS. 1C and 1D show the CB opening and FIGS. 1E and 1F show a word line-bit line short occurring in the aforementioned steps.

In FIG. 1C, dielectric layer 130 exposed by opening 191a is removed by anisotropic etching, using patterned resist layer 191 as an etching mask, in order to form a via 131, as a bit line contact via, exposing drain region 112. The patterned resist layer 191 is then removed. As mentioned above, width of the exposed drain region 112 is approximately 0.038 µm or less, resulting in via 131 being extremely deep relative to the dielectric layer 130. The etching reaction slows as the dielectric layer 130 at the bottom of via 131 is etched, resulting in incomplete etching of the dielectric layer 130 remaining at the bottom of via 131, failing to expose drain region 112.

In FIG. 1D, a barrier layer 140 and conductive layer 150 are formed sequentially in via 131 as a bit line contact. The bit line contact fails to electrically connect to drain region 112 resulting from the remaining dielectric layer 130 between the barrier layer 140 and drain region 112. Thus, a CB opening occurs.

In FIG. 1E, after the step shown in FIG. 1B, dielectric layer 130 exposed by opening 191a is removed by anisotropic etching, using patterned resist layer 191 as an etching mask, in order to form a via 131', as a bit line contact via, exposing drain region 112. The patterned resist layer 191 is then removed. In order to completely remove the dielectric 130 at the bottom of via 131', over-etching is performed on dielectric 130. As shown in FIG. 1A or 1B, hard mask layer 124 and spacer 125 protect gate electrode 120 from electrically connecting to the subsequently formed bit line contact or bit line. Further, dielectric layer 130 of silicon dioxide is etched with high etch selectivity, of about 10, to hard mask layer 124 and spacer 125, to prevent exposure of the conductive layers, polycrystalline silicon layer 122, and metal silicide layer 123, with hard mask layer 124 and spacer 125 of silicon nitride. When over-etching is performed to force etching of the dielectric 130 at the bottom of via 131', a part of hard mask layer 124 and spacer 125 may be removed, thereby exposing the metal silicide layer 123, and more seriously, polycrystalline silicon layer 122 may be exposed.

In FIG. 1F, a barrier layer 140 and conductive layer 150 are formed sequentially in via 131' as a bit line contact. The exposed metal silicide layer 123 electrically connects to the bit line contact. Thus, a word line-bit line short occurs.

SUMMARY OF THE INVENTION

Thus, objects of the present invention are to provide a method of forming a bit line contact via, avoiding CB openings and word line-bit line short in the process to improve process yield and decrease costs of the process.

In order to achieve the described objects, the present invention provides a method of forming a bit line contact via. First, a substrate having a transistor, comprising a gate electrode, drain region, and source region is provided. Then, a conductive layer is formed overlying the drain region, wherein the too surface of the conductive layer is lower than that of the gate electrode. Next, an insulating barrier layer is conformally formed overlying the substrate. Further, a dielectric layer is blanketly formed overlying the insulating barrier layer. Finally, a via is formed through the dielectric layer and insulating barrier layer, thereby exposing the conductive layer.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiments are intended to illustrate the invention more fully without limiting the scope of the claims, since numerous modifications and variations will be apparent to those skilled in this art.

First Embodiment

FIGS. 2A through 2H are cross-sections illustrating a method of forming a bit line contact via in accordance with one embodiment of the present invention.

Step 1

Figure 1A:
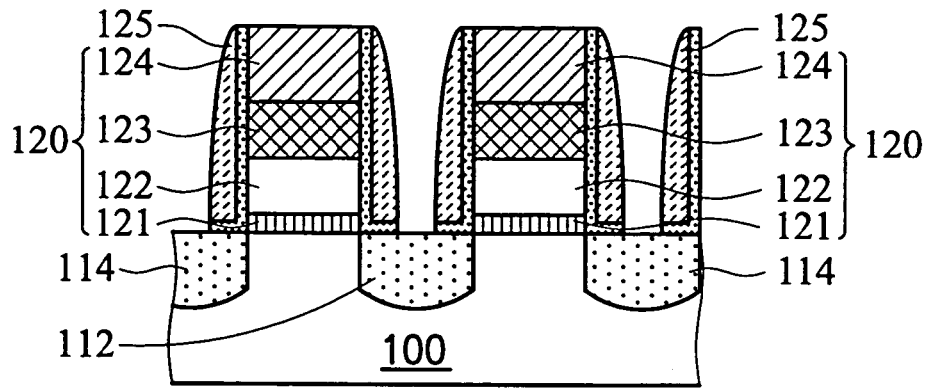
FIGS. 1A through 1F are cross-sections illustrating a CB opening and word line-bit line short during conventional method formation of a bit line contact via.
Figure 1B:
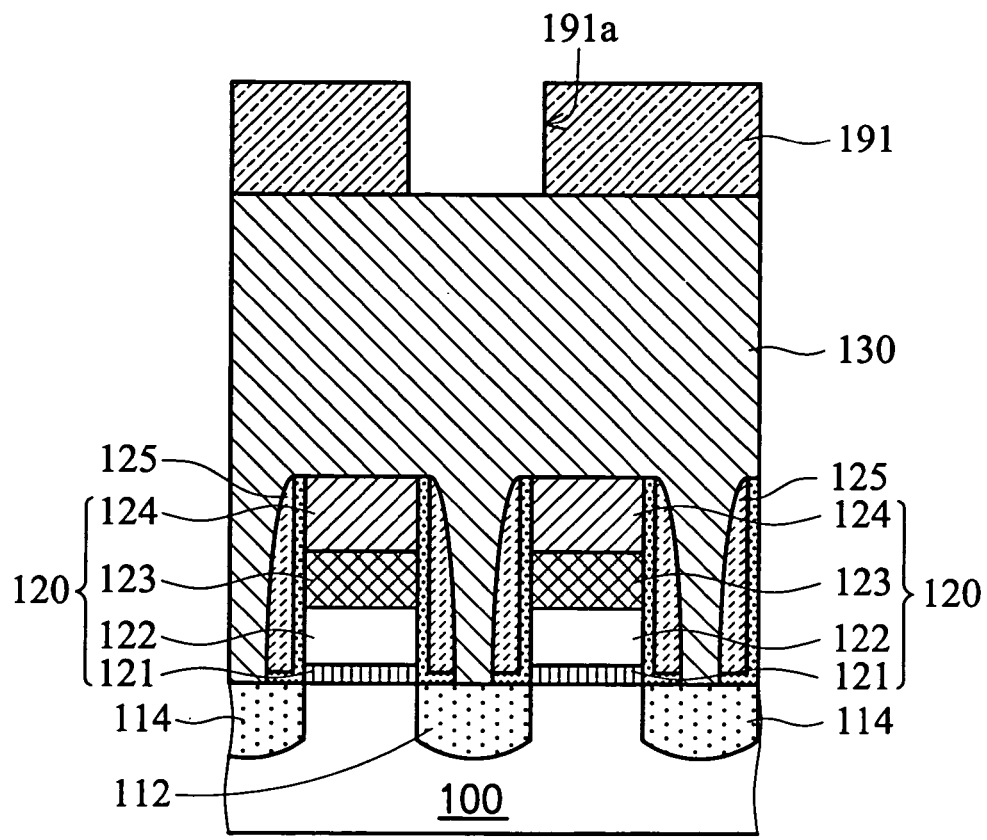
Figure 1C:
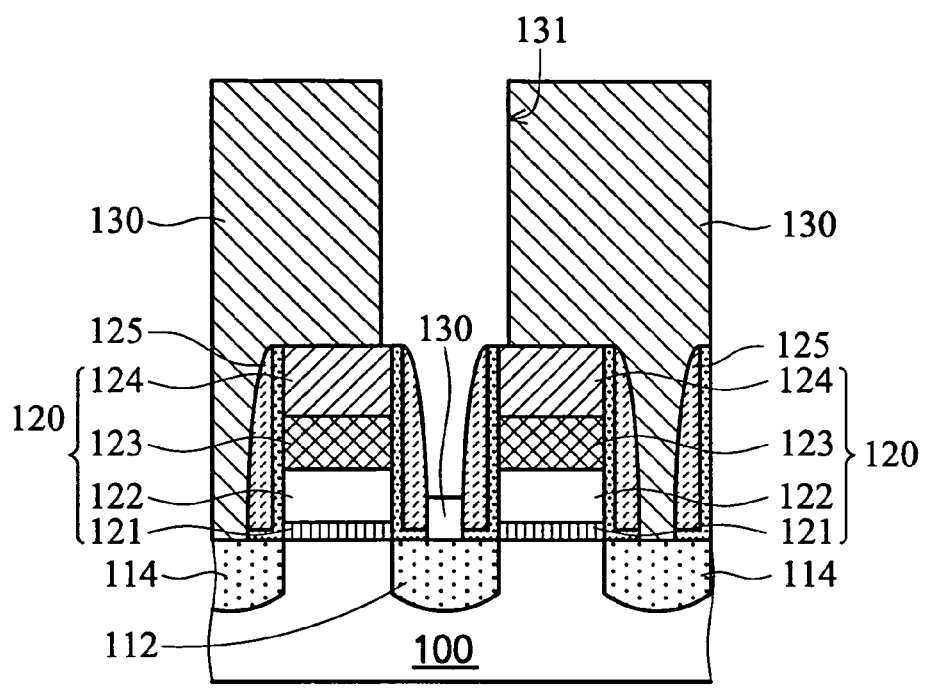
Figure 1D:
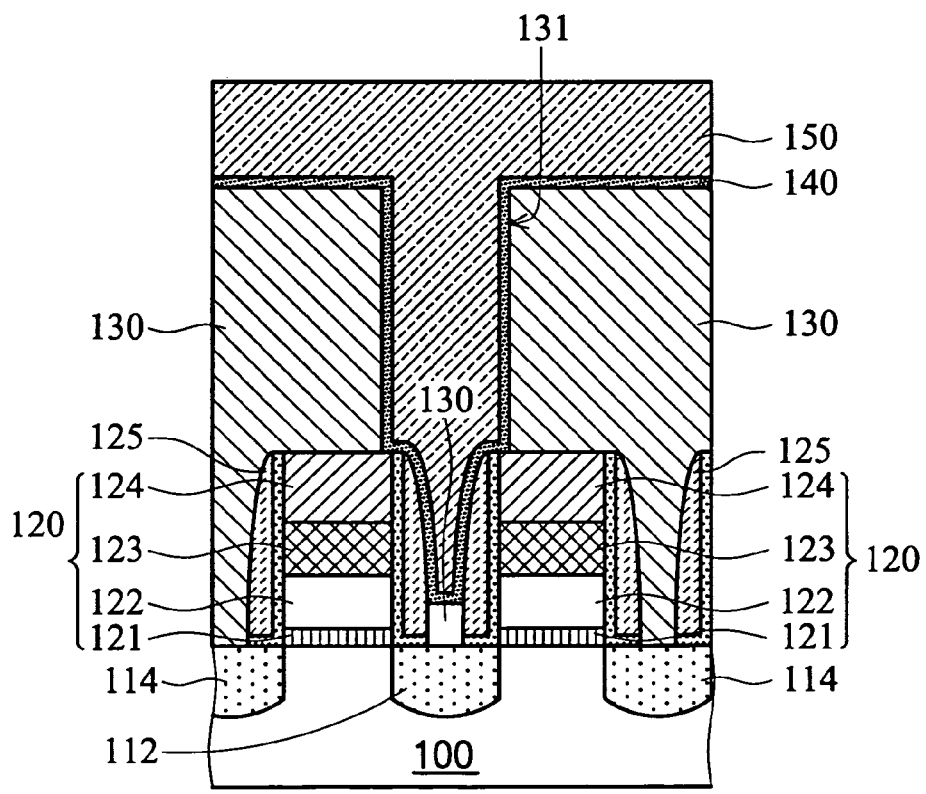
Figure 1E:
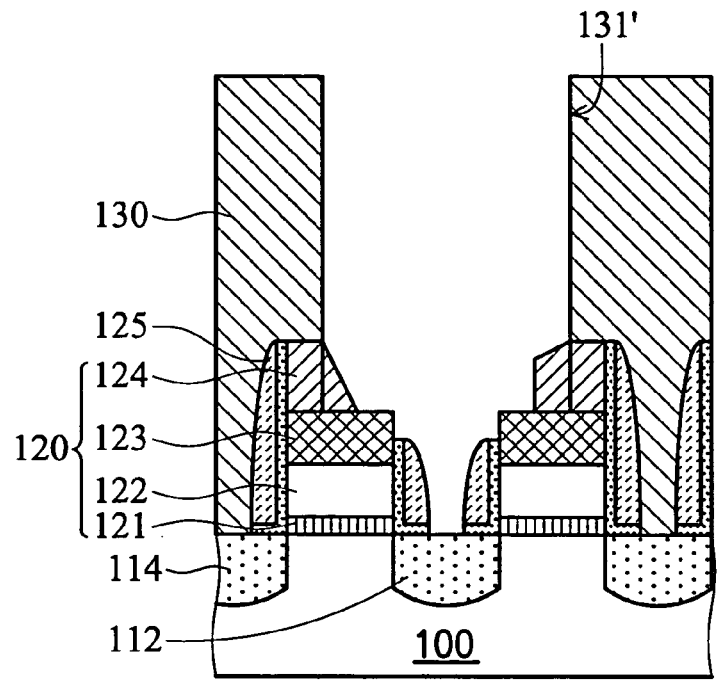
Figure 1F:
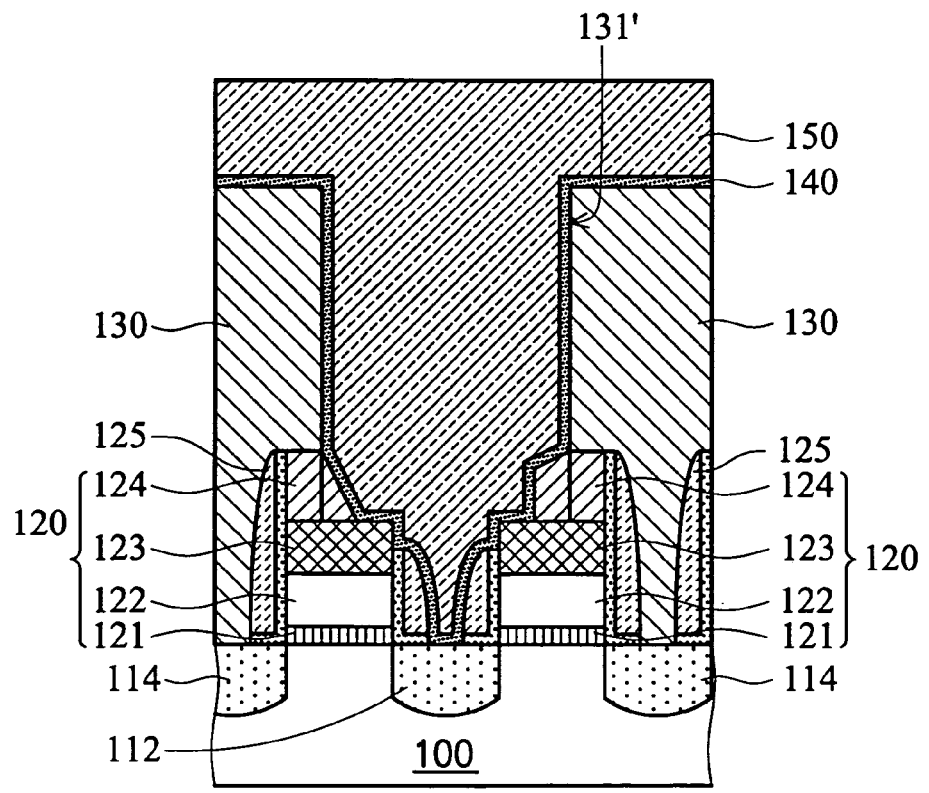
Figure 2A:
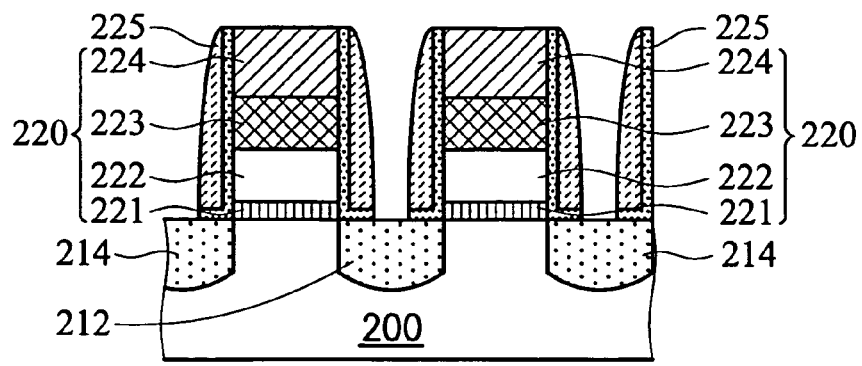
FIGS. 2A through 2H are cross-sections illustrating a method of forming a bit line contact via in accordance with one embodiment of the present invention.

First, in FIG. 2A, a substrate 200, such as single crystalline silicon, having a transistor structure, is provided. The substrate 200 has a gate electrode 220 protruding from an active surface of substrate 200. A drain region 212 and source region 214 are disposed on the active surface on both sides of the gate electrode 220 respectively. Gate electrode 220 is a word line, having a multi-level structure as needed. For example, gate electrode 220 in FIG. 2A can have a gate dielectric layer 221 such as an oxide layer, polycrystalline silicon layer 222 and metal silicide layer 223, such as tungsten silicide, as conductive layers, and hard mask layer 224 of silicon nitride sequentially from the active surface of substrate 200. Gate electrode 220 further has a spacer 225 of, for example, silicon nitride on the sidewall, resulting in a width of the exposed drain region 212 between two neighboring gate electrodes 220 of approximately 0.038 μm or less when design rule is reduced to approximately 0.11 μm. Note that this structure of gate electrode 220 is an example, and is not intended to limit the scope of the present invention. Those skilled in the art will recognize the possibility for use of any disclosed gate electrode structure to process the present invention.

Step 2

Next, a conductive layer 270 such as doped polycrystalline silicon layer is formed overlying drain region 212 prior to forming a dielectric layer overlying substrate 200 in order to prevent a CB opening and word line-bit line short from occurring, thereby improving process yield and decreasing costs of the process.

Figure 2B:
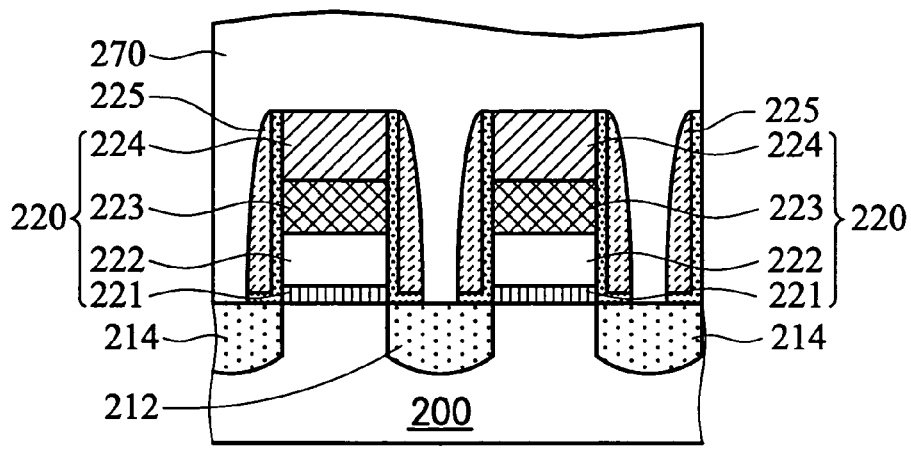

In FIG. 2B, a conductive layer 270 is blanketly formed overlying substrate 200 using methods such as chemical vapor deposition (CVD) or physical vapor deposition (PVD). It is preferable to form a polycrystalline silicon layer, doped with an element in either group 13 (IIIA) or 15 (VA) of the periodic table such as As, as the conductive layer 270 using CVD.

Figure 2C:
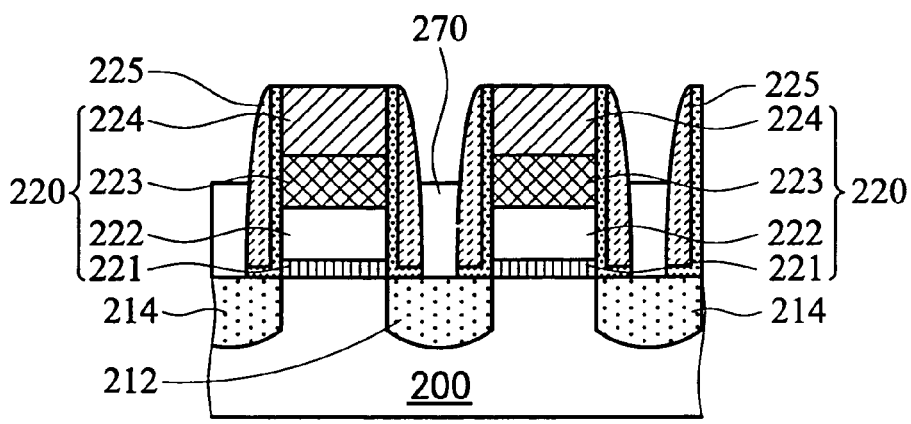

In FIG. 2C, the unwanted conductive layer 270 is removed by etching or chemical mechanical polishing (CMP), the remaining conductive layer 270 is thinner than gate electrode 220 overlying drain region 212 and source region 214 among gate electrodes 220.

Figure 2D:
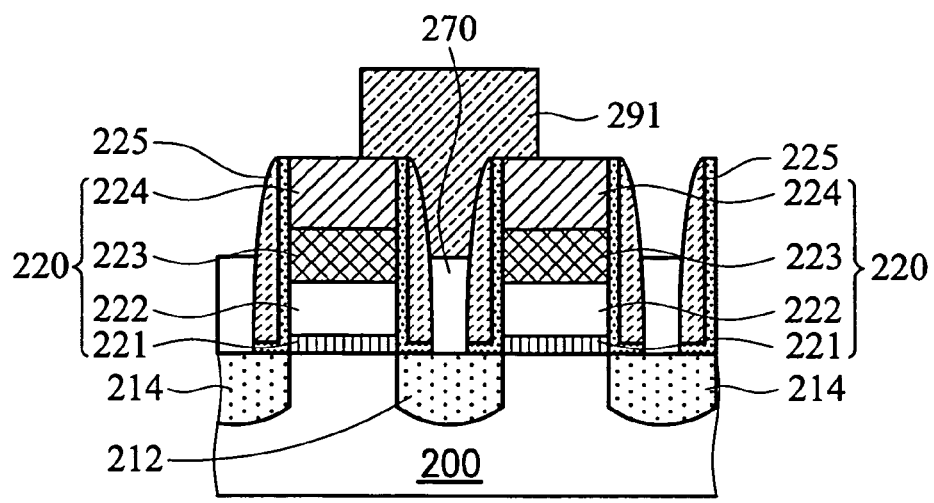

In FIG. 2D, a patterned resist layer 291 is formed overlying substrate 200, exposing the conductive layer 270 overlying source region 214 and other positions not forming contact.

Figure 2E:
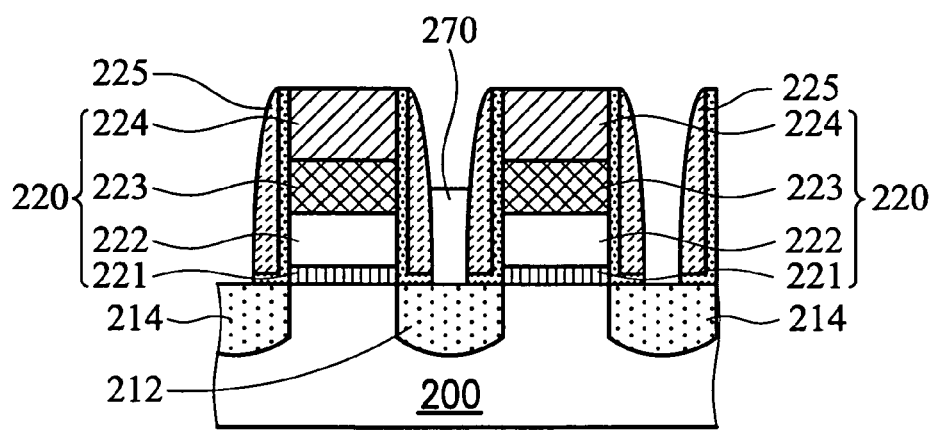

In FIG. 2E, the exposed conductive layer 270 is removed by anisotropic etching using patterned resist layer 291 as an etching mask, thereby the conductive layer 270 remaining overlying drain region 212, predetermined to form bit line contact via. The patterned resist layer 292 is then removed.

Note that the aforementioned flow in FIGS. 2B through 2E is an example, and is not intended to limit the scope of the present invention. Those skilled in the art will recognize the possibility of using any flow to process step 2 of this embodiment. In one example, another patterned resist layer (not shown) can be formed previous to the overlying substrate 200, exposing drain region 212, and the conductive layer 270 can then be formed overlying drain region 212. In another example, the conductive layer 270 can be formed directly overlying the drain region 212 using a well-controlled recipe by selective deposition.

Step 3

Figure 2F:
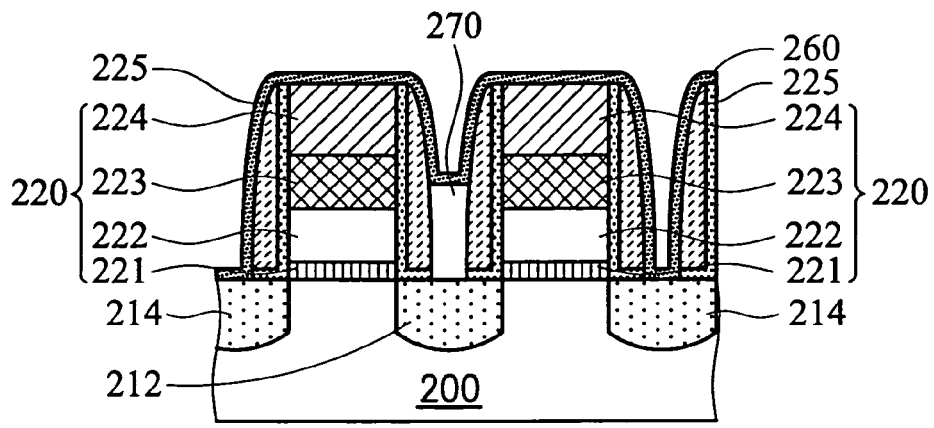

In FIG. 2F, an insulating barrier layer 260 such as silicon nitride is conformally formed overlying substrate 200. When a dielectric layer such as an oxide layer is subsequently formed overlying substrate 200, insulating barrier layer 260 prevents inter-diffusion between the dielectric layer and conductive layer 270, which can negatively affect the electrical performance of substrate 200.

Step 4

Figure 2G:
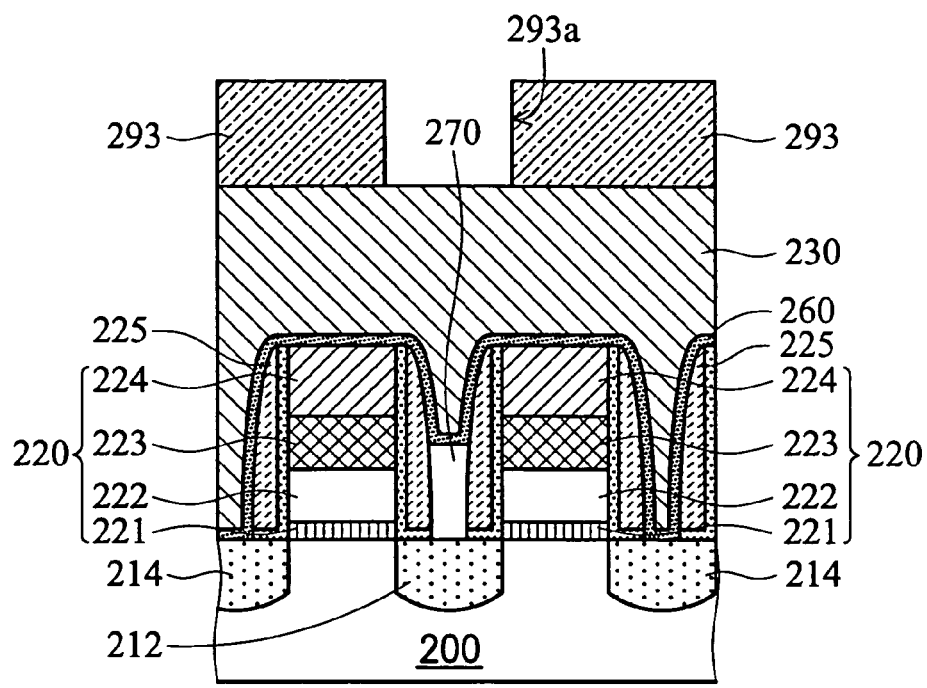

In FIG. 2G, a dielectric layer 230 such as an oxide layer and patterned resist layer 293 are sequentially formed overlying substrate 200. Further, formation of dielectric layer 230 can be divided into a plurality of sub-steps such as forming a boro-phosphosilicate glass (BPSG) layer (not shown), capable of filling a tiny hole, overlying substrate 200, planarizing the BPSG layer, blanketly forming an oxide layer (not shown) overlying the BPSG layer using methods such as CVD, using a precursor comprising tetra ethoxysilane (TEOS), and planarizing the oxide layer. The patterned resist layer 293 has an opening 293a exposing a part of dielectric layer 230, where a bit line contact via is subsequently formed.

Step 5

Figure 2H:
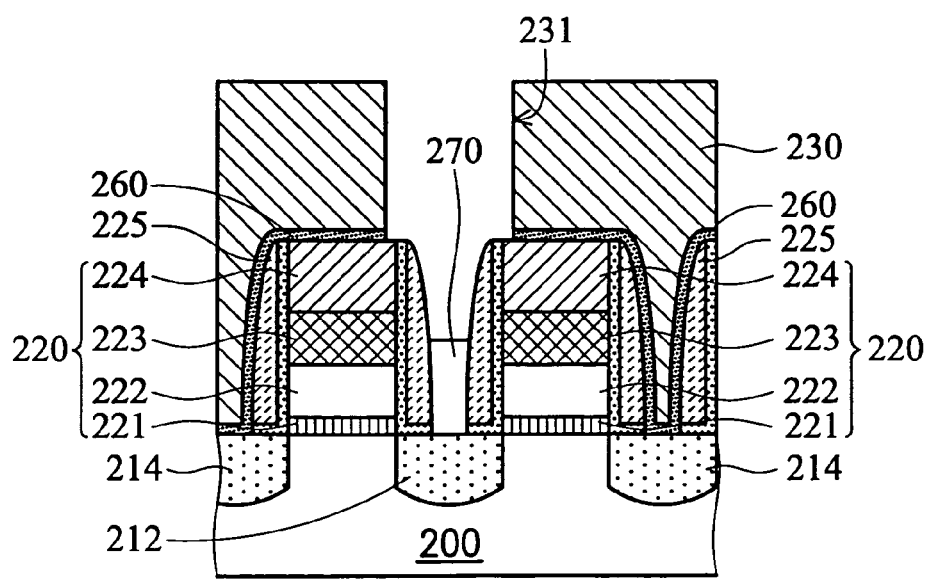

In FIG. 2H, a via 231 is formed through dielectric layer 230 and insulating barrier layer 260 by anisotropically etching dielectric layer 230 and insulating barrier layer 260, using patterned resist layer 293 as an etching mask. The via 231, exposes conductive layer 270 and is a bit line contact via. The patterned resist layer 293 is then removed.

Thus, the results shown prove the efficacy of the inventive method in forming a conductive layer as bit line contact overlying a drain region prior to forming a dielectric layer overlying the substrate, avoiding both CB opening and word line-bit line shorts as seen in the known art, thereby improving process yield and decreasing costs, achieving the objects of the present invention.

Second Embodiment

FIGS. 3A through 3I are cross-sections illustrating a method of forming a bit line contact via in accordance with the second embodiment of the present invention.

Step 1

Figure 3A:
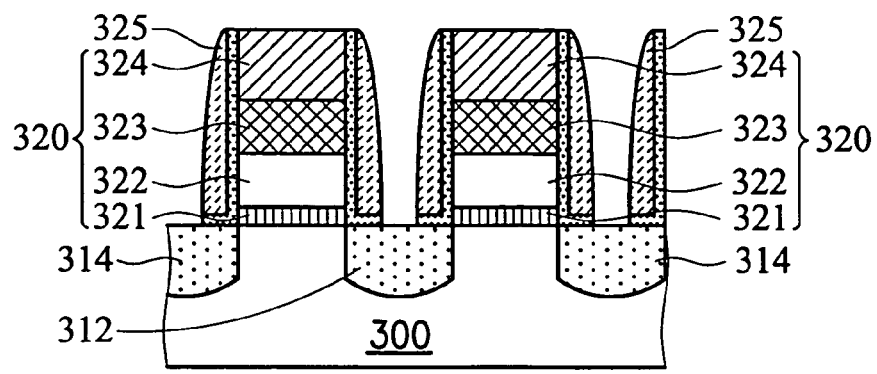
FIGS. 3A through 3I are cross-sections illustrating a method of forming a bit line contact via in accordance with the second embodiment of the present invention.

In FIG. 3A, a substrate 300, such as single crystalline silicon, having a transistor structure is provided. The substrate 300 has a gate electrode 320 protruding from an active surface of substrate 300. A drain region 312 and source region 314 are disposed on the active surface respectively on both sides of the gate electrode 320. Gate electrode 320 is a word line, having a multi-level structure as needed. For example, gate electrode 320 in FIG. 3A can have gate dielectric layer 321 such as an oxide layer, polycrystalline silicon layer 322 and metal silicide layer 323, such as tungsten silicide, as conductive layers, and hard mask layer 324 such as silicon nitride sequentially from the active surface of substrate 300. Gate electrode 320 further has a spacer 325 such as silicon nitride on the sidewall, resulting in the width of exposed drain region 312 between the two neighboring gate electrodes 320 of approximately 0.038 μm or less when the design rule is reduced to approximately 0.11 μm. Note that this structure of gate electrode 320 is an example, and is not intended to limit the scope of the present invention. Those skilled in the art will recognize the possibility for use of any disclosed gate electrode structure to process the present invention.

Step 2

Figure 3B:
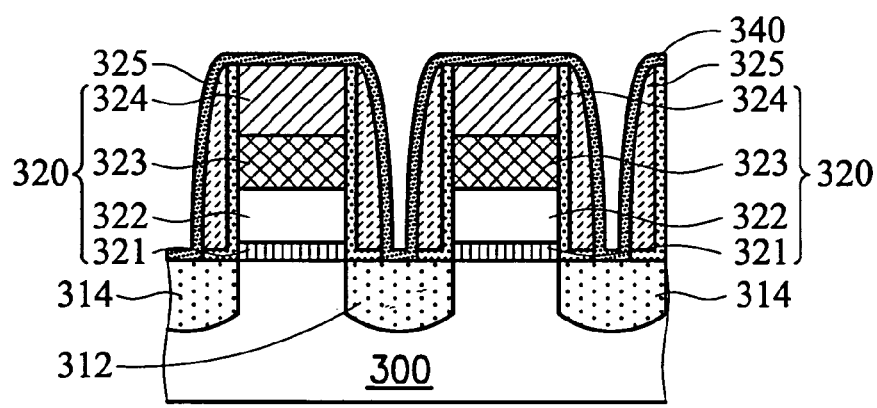

In FIG. 3B, a conductive layer 300 is conformally formed overlying substrate 200. More specifically, conductive layer 300 is formed on the surface of spacer 325, drain region 312, and source region 314. The conductive layer 340 preferably comprises a metal/metal compound layer such as a Ti/TiSi layer.

Step 3

Figure 3C:
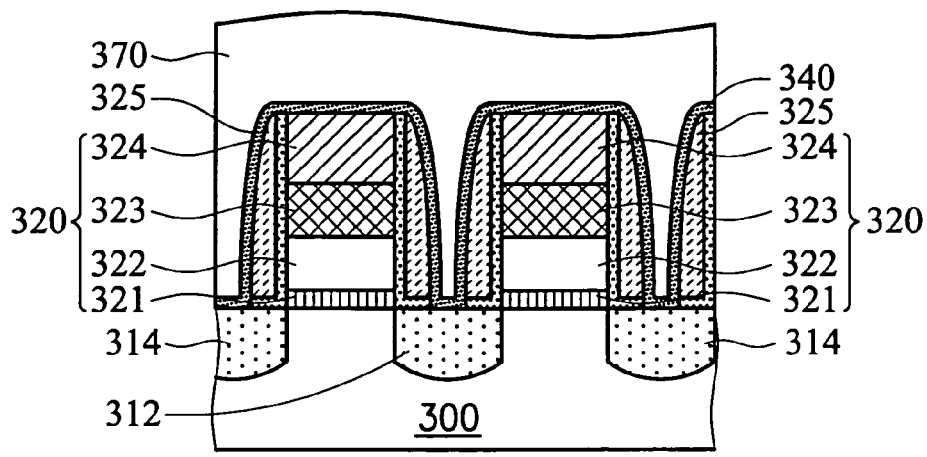

In FIG. 3C, a conductive, doped polycrystalline silicon layer 370 is blanketly formed overlying substrate 300 by methods such as CVD. The doped polycrystalline silicon layer 370 is preferably doped with an element in either group 13 (IIIA) or 15 (VA) of periodic table, such as As.

Step 4

During step 4 of this embodiment, the unwanted conductive layer 340 and doped polycrystalline silicon layer 370 are removed, remaining the doped polycrystalline silicon layer 370 thinner than gate electrode 320 and the conductive layer 340 under the remained doped polycrystalline silicon layer 370 overlying drain region 312. During steps 3 and 4 of this embodiment, the present invention forms the conductive, doped polycrystalline silicon layer 370 overlying drain region 312 prior to forming a dielectric overlying substrate 200, in order to avoid CB opening and word line-bit line shorts from occurring, thus improving process yield and decreasing costs of the process.

Figure 3D:
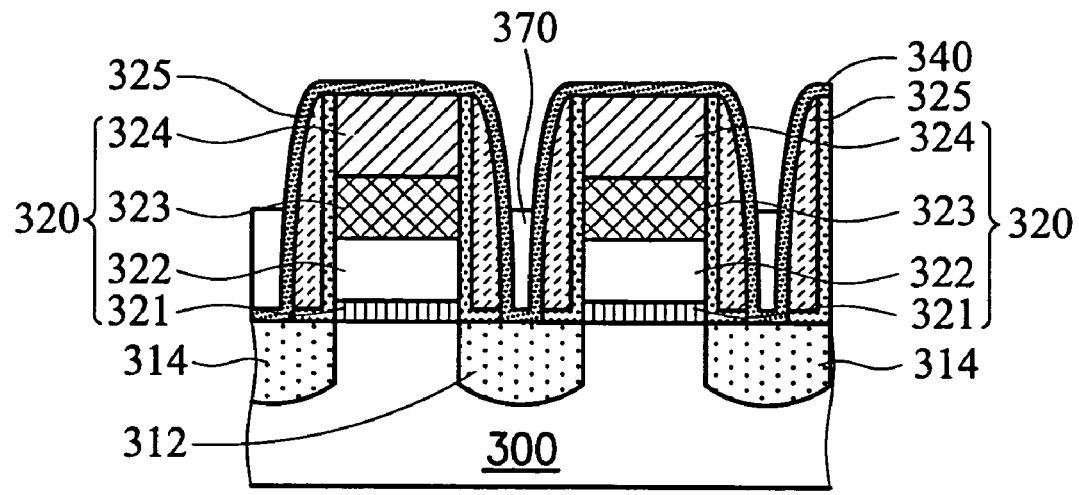

In FIG. 3D, the unwanted doped polycrystalline silicon layer 370 is removed by etching or CMP, remaining the doped polycrystalline silicon layer 370 thinner than gate electrode 320 overlying drain region 312 and source region 314.

Figure 3E:
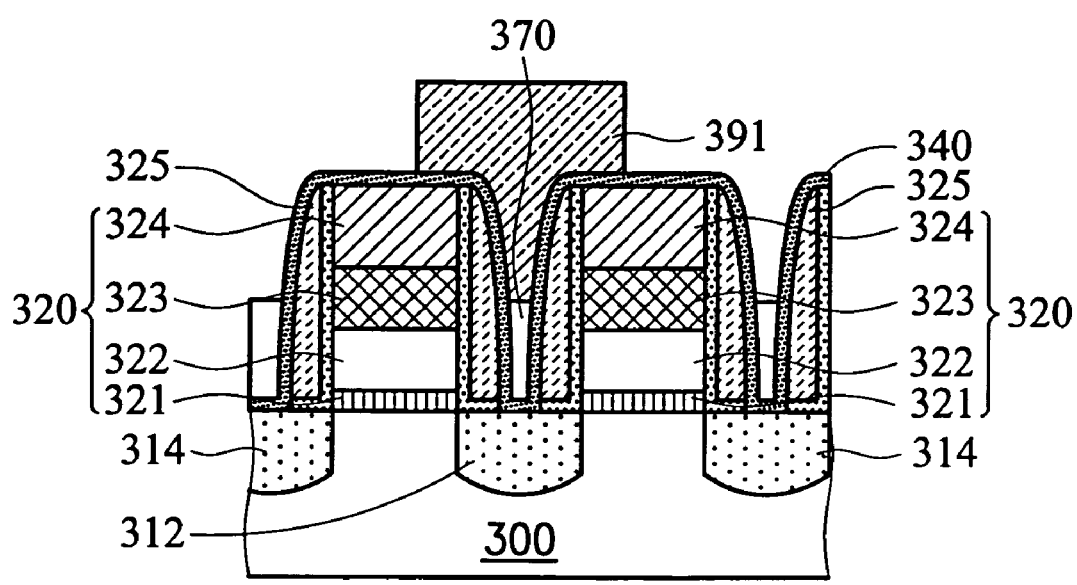

In FIG. 3E, a patterned resist layer 391 is formed overlying substrate 300, exposing the doped polycrystalline silicon layer 370 above source region 314 and other positions not forming contact.

Figure 3F:
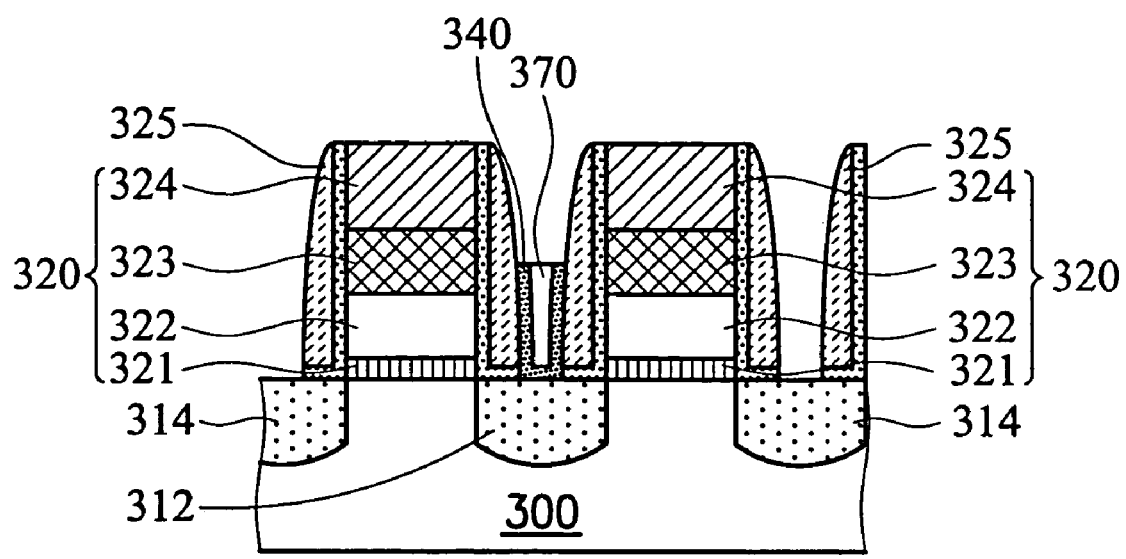

In FIG. 3F, the exposed doped polycrystalline silicon layer 370 is removed by anisotropic etching, using patterned resist layer 391 as an etching mask and conductive layer 340 as a stop layer, thereby remaining the doped polycrystalline silicon layer 370 overlying drain region 312 predetermined to form bit line contact. Then, the patterned resist layer 391 is removed by methods such as ashing using removers such as oxygen plasma, thereby exposing the conductive layer 340 overlying source region 314 and other positions not forming contact. Next, the exposed conductive layer 340 is removed. When conductive layer 340 comprises a Ti/TiSi layer, the exposed conductive layer 340 can be removed by SPM (sulfuric acid-hydrogen peroxide mixture) and APM (ammonium hydrogen peroxide mixture).

Step 5

Figure 3G:
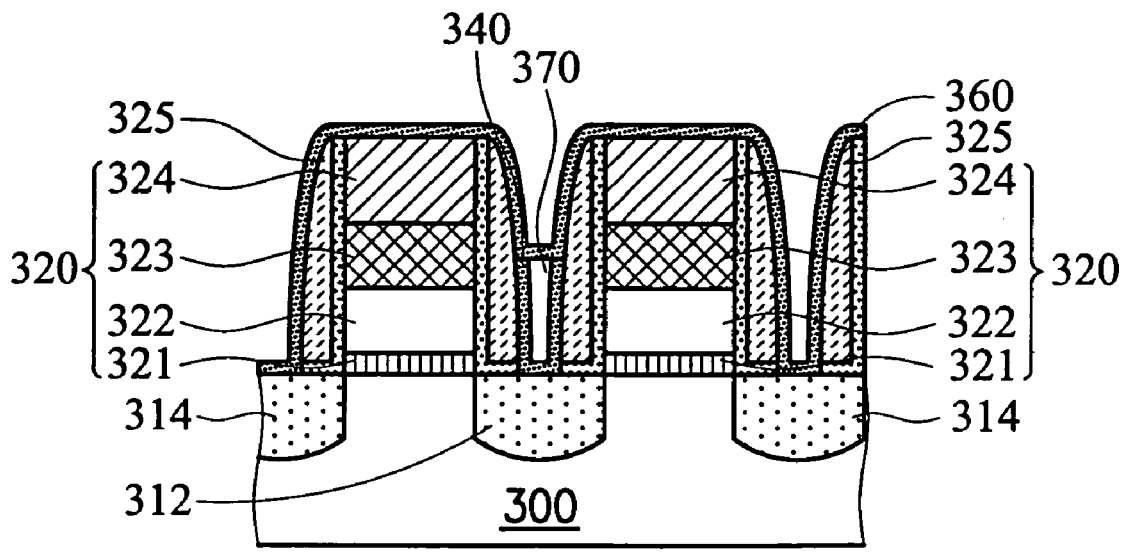

In FIG. 3G, an insulating barrier layer 360 such as silicon nitride is conformally formed overlying substrate 300. When a dielectric layer such as an oxide layer is subsequently formed overlying substrate 300, insulating barrier layer 360 prevents inter-diffusion between the dielectric layer and conductive layer 370, which can negatively affect the electrical performance of substrate 300.

Step 6

Figure 3H:
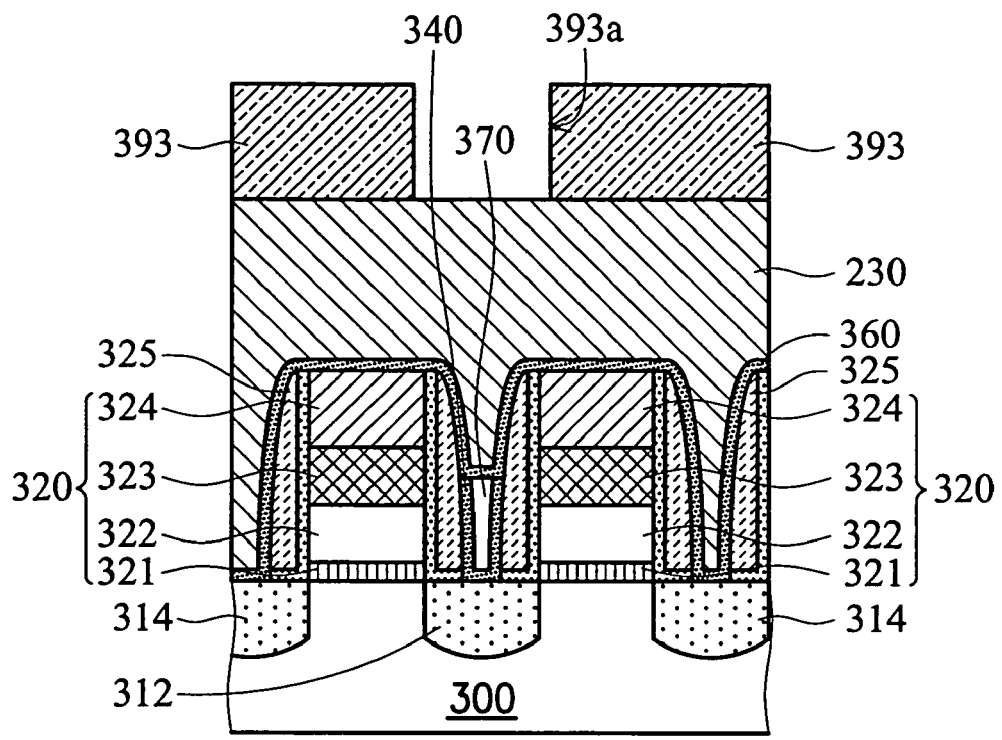

In FIG. 3H, a dielectric layer 330 such as oxide layer and patterned resist layer 393 are sequentially formed overlying substrate 300. Further, formation of dielectric layer 330 can be divided into a plurality of sub-steps such as forming a boro-phosphosilicate glass (BPSG) layer (not shown), capable of filling a tiny hole, overlying substrate 300, planarizing the BPSG layer, blanketly forming an oxide layer (not shown) overlying the BPSG layer using methods such as CVD, using a precursor comprising tetra ethoxysilane (TEOS), and planarizing the oxide layer. The patterned resist layer 393 has an opening 393a exposing a part of dielectric layer 330, where a bit line contact via is subsequently formed.

Step 7

Figure 3I:
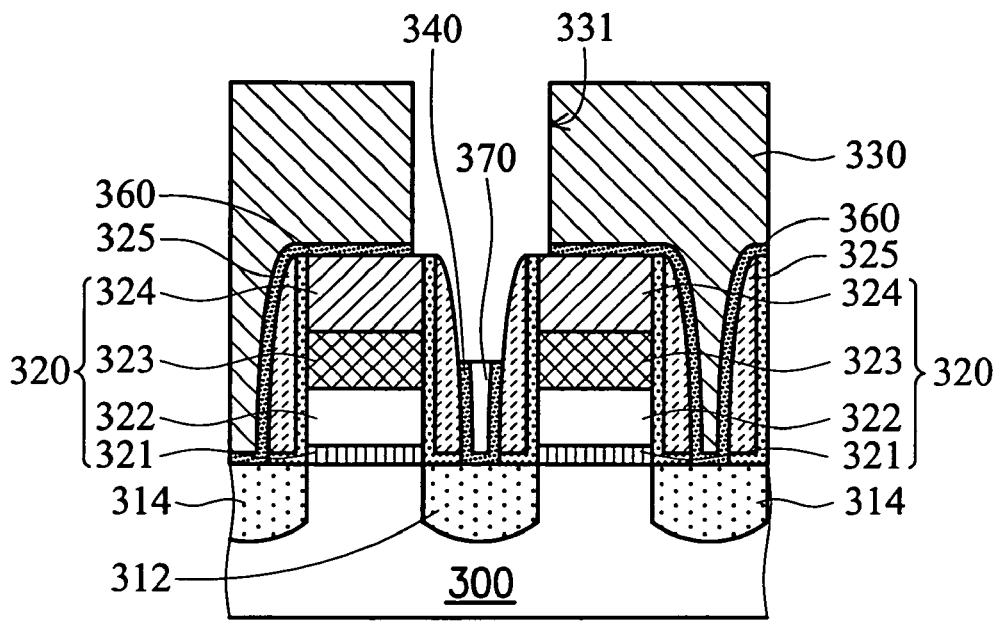

In FIG. 3I, a via 331 is formed through dielectric layer 330 and insulating barrier layer 360 by anisotropically etching dielectric layer 330 and insulating barrier layer 360 using patterned resist layer 393 as an etching mask. The via 331 exposes conductive layer 370 and is a bit line contact via. The patterned resist layer 393 is then removed.

Thus, the results shown prove the efficacy of the inventive method in forming a conductive layer as bit line contact overlying a drain region prior to forming a dielectric layer overlying the substrate, avoiding both CB opening and word line-bit line shorts as seen in the known art, thereby improving process yield and decreasing costs, thereby achieving the objects of the present invention.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of forming a bit line contact via, comprising:
providing a substrate with a transistor thereon, the transistor having a gate electrode, drain region, and source region;
forming a conductive layer overlying the drain region, wherein the top surface of the conductive layer is lower than that of the gate electrode, wherein forming the conductive layer further comprises:
blanketly forming a layer of conductive material overlying the substrate;
removing a portion of the conductive material layer, leaving the conductive layer overlying the drain region and source region, wherein the top surface of the conductive layer is lower than that of the gate electrode;
forming a patterned resist layer exposing the conductive layer overlying the source region;
removing the exposed conductive layer using the patterned resist layer as a mask; and
removing the Patterned resist layer;
conformally forming an insulating barrier layer overlying the substrate;
blanketly forming a dielectric layer overlying the insulating barrier layer; and
forming a via through the dielectric layer and insulating barrier layer, exposing the conductive layer.

2. The method as claimed in claim 1, wherein the conductive layer is doped polycrystalline silicon.

3. The method as claimed in claim 2, wherein the conductive layer is doped with an element in either group 13 (IIIA) or 15 (VA) of periodic table.

4. The method as claimed in claim 2, wherein the conductive layer is doped with As.

5. The method as claimed in claim 1, wherein the insulating barrier layer is SiN.

6. The method as claimed in claim 1, wherein the dielectric layer comprises an oxide.

7. The method as claimed in claim 1, wherein the dielectric layer comprises boro-phosphosilicate glass (BPSG).

8. A method of forming a bit line contact via, comprising:
providing a substrate with a transistor thereon, the transistor having a gate electrode, drain region, and source region;
forming a conductive layer overlying the drain region, wherein the top surface of the conductive layer is lower than that of the gate electrode, wherein forming the conductive layer further comprises:
conformally forming a metal/metal compound layer overlying the substrate;
blanketly forming a layer of conductive material overlying the substrate;
removing a portion of the conductive material layer, leaving the conductive layer overlying the drain region and source region, wherein the top surface of the conductive layer is lower than that of the gate electrode;
forming a patterned resist layer exposing the conductive layer overlying the source region;
removing the exposed conductive layer using the patterned resist layer as a mask and the metal/metal compound layer as a stop layer, thereby exposing the metal/metal compound layer overlying the source region; and
removing the patterned resist layer and exposed metal/metal compound layer;
conformally forming an insulating barrier layer overlying the substrate;
blanketly forming a dielectric layer overlying the insulating barrier layer; and
forming a via through the dielectric layer and insulating barrier layer, exposing the conductive layer.

9. The method as claimed in claim 8, wherein the metal/metal compound layer comprises a Ti/TiSi layer.

10. A method of forming a bit line contact via, comprising:
providing a substrate with a transistor thereon, the transistor having a gate electrode, drain region, and source region;
forming a conductive layer overlying the drain region, wherein the top surface of the conductive layer is lower than that of the gate electrode, wherein forming the conductive layer further comprises:
conformally forming a Ti/TiSi layer overlying the substrate;
blanketly forming a layer of conductive material overlying the substrate;
removing a portion of the conductive material layer, leaving the conductive layer overlying the drain region and source region, wherein the top surface of the conductive layer is lower than that of the gate electrode;
forming a patterned resist layer exposing the conductive layer overlying the source region;
removing the exposed conductive layer using the patterned resist layer as a mask and the Ti/TiSi layer as a stop layer, thereby exposing the Ti/TiSi layer overlying the source region;
ashing the patterned resist layer using oxygen plasma; and
removing the exposed Ti/TiSi layer using SPM (sulfuric acid-hydrogen peroxide mixture) and APM (ammonium hydroxide peroxide mixture);
conformally forming an insulating barrier layer overlying the substrate;
blanketly forming a dielectric layer overlying the insulating barrier layer; and
forming a via through the dielectric ayer and insulating barrier layer, exposing the conductive layer.

11. A method of a forming bit line contact via, comprising:
providing a substrate with a transistor thereon, the transistor having a gate electrode, drain region, and source region;
conformally forming a conductive layer overlying the substrate;
blanketly forming a doped polycrystalline silicon layer overlying the substrate;
removing the unwanted conductive layer and doped polycrystalline silicon layer, leaving the doped polycrystalline layer thinner than the gate electrode, overlying the drain region, and the conductive layer covered by the doped polycrystalline silicon layer;
conformally forming an insulating barrier layer overlying the substrate;
blanketly forming a dielectric layer overlying the insulating barrier layer; and
forming a via through the dielectric layer and insulating barrier layer, exposing the doped polycrystalline silicon layer.

12. The method as claimed in claim 11, wherein removing the unwanted conductive layer and doped polycrystalline silicon layer further comprises:
removing a part of the doped polycrystalline silicon layer using etching or chemical mechanical polishing (CMP), thereby leaving the doped polycrystalline silicon layer, thinner than the gate electrode, overlying the drain region and source region;
forming a patterned resist layer exposing the doped polycrystalline silicon layer overlying the source region;
removing the exposed polycrystalline silicon layer using the patterned resist layer as a mask and the conductive layer as a stop layer, thereby exposing the conductive layer overlying the source region; and
removing the patterned resist layer and exposed conductive layer.

13. The method as claimed in claim 11, wherein the conductive layer comprises a Ti/TiSi layer, and removing the unwanted conductive layer and doped polycrystalline silicon layer further comprises:
removing a part of the doped polycrystalline silicon layer using etching or chemical mechanical polishing (CMP), thereby leaving the doped polycrystalline silicon layer thinner than the gate electrode, overlying the drain region and source region;
forming a patterned resist layer exposing the doped polycrystalline silicon layer overlying the source region;
removing the exposed polycrystalline silicon layer using the patterned resist layer as a mask and the conductive layer as a stop layer, thereby exposing the conductive layer overlying the source region;
ashing the patterned resist layer using oxygen plasma; and removing the exposed conductive layer using SPM (sulfuric acid-hydrogen peroxide mixture) and APM (ammonium hydrogen peroxide mixture).

14. The method as claimed in claim 11, wherein the insulating barrier layer is SiN.

15. The method as claimed in claim 11, wherein the dielectric layer comprises an oxide.

16. The method as claimed in claim 11, wherein the dielectric layer comprises boro-phosphosilicate glass (BPSG).

17. The method as claimed in claim 11, wherein the doped polycrystalline silicon layer is doped with an element in either group 13 (IIIA) or 15 (VA) of periodic table.

18. The method as claimed in claim 11, wherein the doped polycrystalline silicon layer is doped with As.

19. A method of a forming bit line contact via; comprising:
   providing a substrate with a transistor thereon, the transistor having a gate electrode, drain region, and source region;
   conformally forming a Ti/TiSi layer overlying the substrate;
   blanketly forming a doped polycrystalline silicon layer overlying the substrate;
   removing a part of the doped polycrystalline silicon layer, leaving the doped polycrystalline silicon layer thinner than the gate electrode, overlying the drain region and source region;
   forming a patterned resist layer exposing the doped polycrystalline silicon layer overlying the source region;
   removing the exposed polycrystalline silicon layer using the patterned resist layer as a mask and the Ti/TiSi layer as a stop layer, thereby exposing the Ti/TiSi layer overlying the source region;
   ashing the patterned resist layer using oxygen plasma;
   removing the exposed Ti/TiSi layer using SPM (sulfuric acid-hydrogen peroxide mixture) and APM (ammonium hydrogen peroxide mixture);
   conformally forming an SiN layer overlying the substrate;
   blanketly forming a dielectric layer overlying the SiN layer; and
   forming a via through the dielectric layer and SiN layer, exposing the doped polycrystalline silicon layer.

* * * * *